United States Patent [19]

Enomoto

[11] Patent Number: 4,500,564
[45] Date of Patent: Feb. 19, 1985

[54] METHOD FOR SURFACE TREATMENT BY ION BOMBARDMENT

[75] Inventor: Yuji Enomoto, Ibaraki, Japan

[73] Assignees: Agency of Industrial Science & Technology; Ministry of International Trade & Industry, both of Tokyo, Japan

[21] Appl. No.: 460,937

[22] Filed: Jan. 25, 1983

[30] Foreign Application Priority Data

Feb. 1, 1982 [JP] Japan ................................. 57-14638
Mar. 23, 1982 [JP] Japan ................................. 57-45994

[51] Int. Cl.³ .............................................. B05D 3/06
[52] U.S. Cl. ....................................... 427/39; 427/35; 427/38; 427/46; 134/1
[58] Field of Search ................... 427/38, 39, 35, 46; 134/1

[56] References Cited

U.S. PATENT DOCUMENTS

| | | | |
|---|---|---|---|
| 3,272,175 | 9/1966 | Lorenz | 118/718 |
| 3,326,177 | 6/1967 | Taylor | 427/46 |
| 3,411,938 | 11/1968 | Storck | 427/328 |
| 4,099,969 | 7/1978 | Leder | 427/39 |
| 4,256,780 | 3/1981 | Gaerttner et al. | 427/38 |

Primary Examiner—John E. Kittle
Assistant Examiner—James J. Seidleck
Attorney, Agent, or Firm—Oblon, Fisher, Spivak, McClelland & Maier

[57] ABSTRACT

An article to be coated by vacuum deposition of a metallic substance is given a preliminary surface treatment to ensure perfect deposition of the metallic substance. This preliminary surface treatment is effected by placing the article under treatment in an atmosphere of the same reaction gas vacuumized to the same degree as during vacuum deposition, causing a hot filament to release thermionicelectrons within the atmosphere thereby inducing the phenomenon of discharge, and causing ions by the discharge to bombard the article under treatment.

3 Claims, 13 Drawing Figures

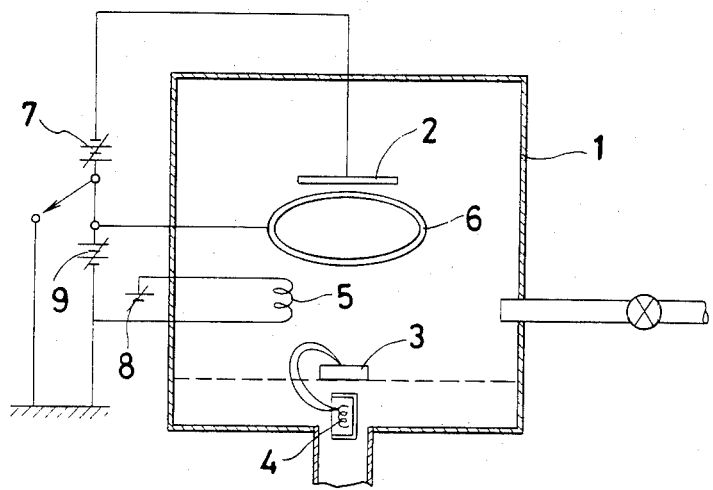
Fig_1
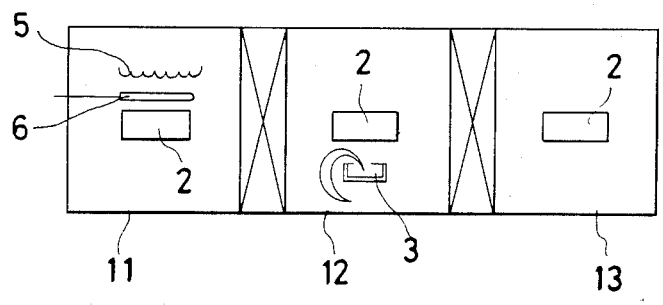
Fig_2

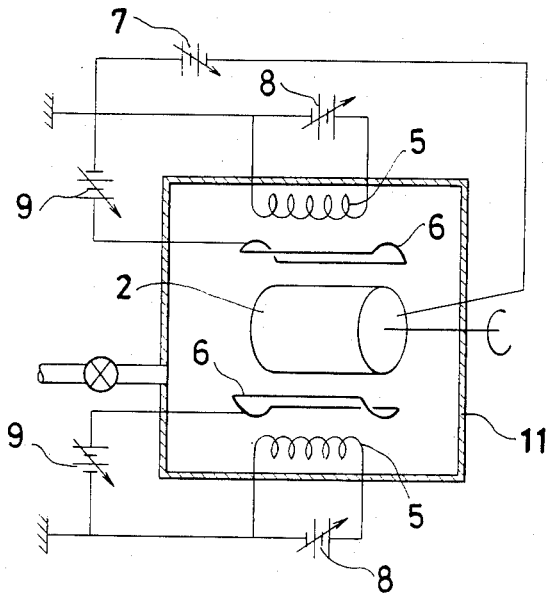
Fig_3
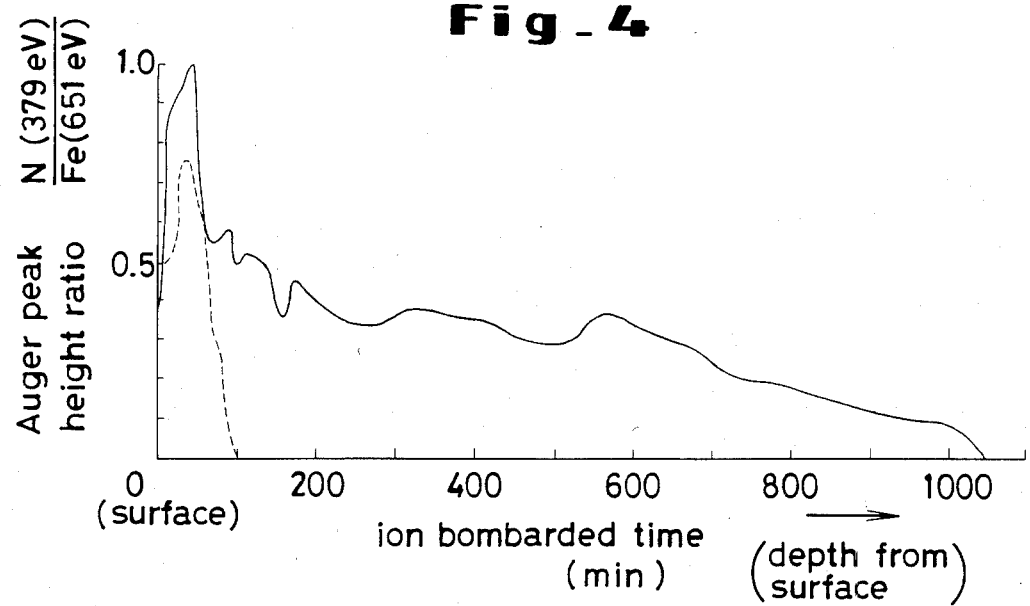
Fig_4

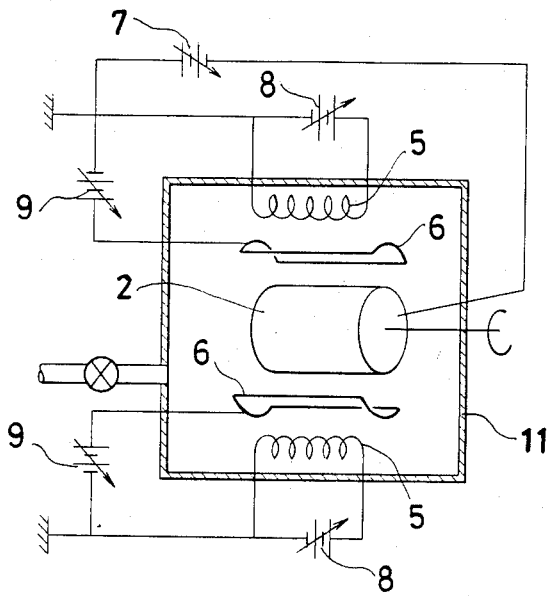
Fig_3
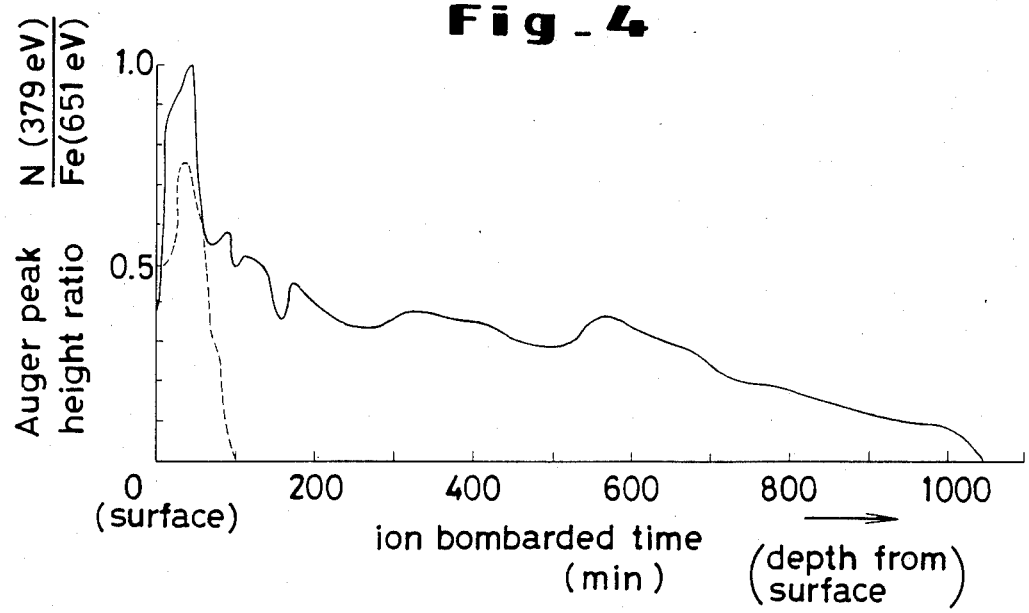
Fig_4

Fig_5
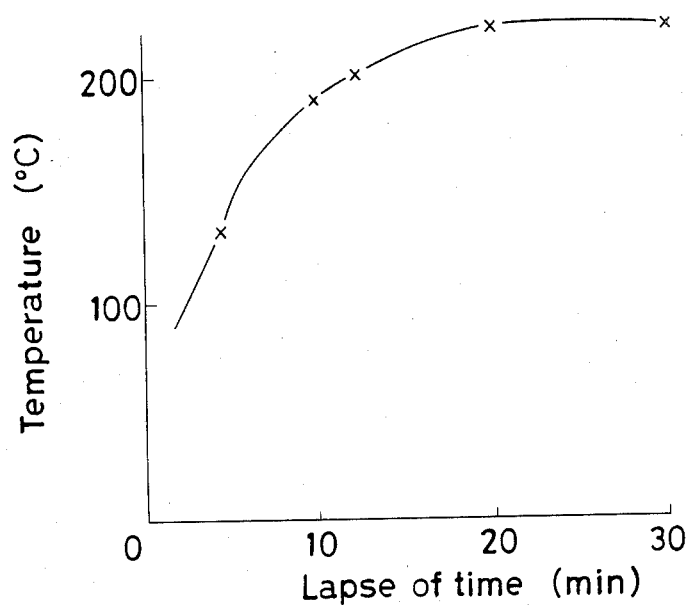
Fig_6
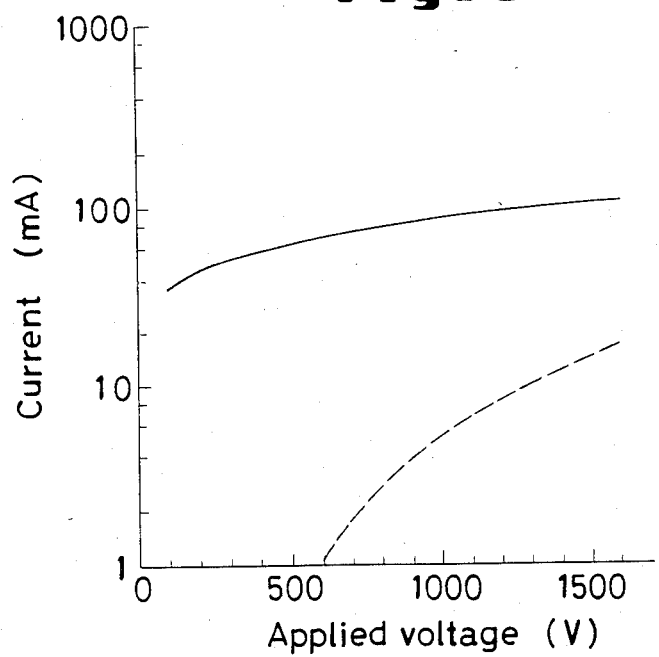

Fig_9(A)
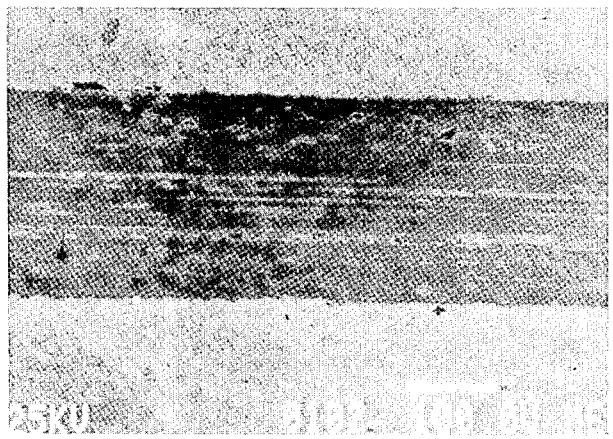
Fig_9(B)
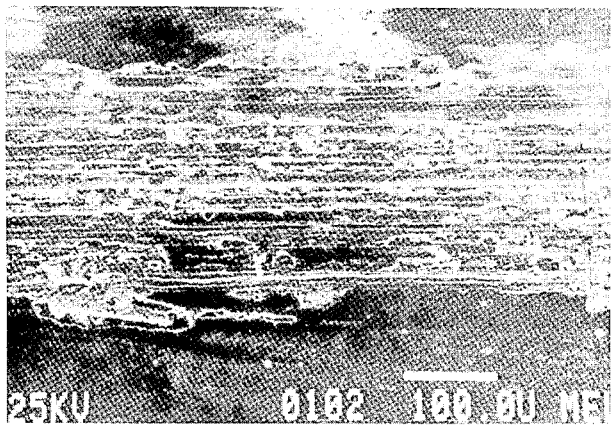
Fig_10(A)    Fig_10(B)
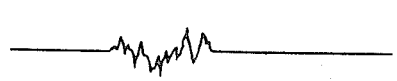

METHOD FOR SURFACE TREATMENT BY ION BOMBARDMENT

BACKGROUND OF THE INVENTION

This invention relates to a method for the surface treatment of a material by exposing the surface to ion bombardment caused by generating electric discharge within a vacuumized airtight container.

The glow discharge surface treatment which is one form of surface treatment performed on a metallic material effects desired cleaning of the surface of the metallic material by disposing the metallic material as a cathode within an airtight container with the surface thereof for treatment opposed to an anode, vacuumizing the container, introducing into the container a gas for glow discharge of the order of $10^{-2}$ Torr, and applying a high-voltage DC current between the opposed electrodes thereby generating glow discharge therein. Thus, the metallic material, before being subjected to a reactive evaporation treatment, has the surface thereof cleaned by applying a DC voltage of $-1000$ V to $-2000$ V to the metallic material enclosed with an inert gas such as argon under a vacuum of about $10^{-2}$ Torr thereby generating glow discharge and bombarding the surface of the metallic material with ionized argon species.

This method, while in the interval between the time the sputter cleaning treatment is completed and the time the reactive evaporation treatment is started, necessitates the work of evacuating the gas used for sputter cleaning, introducing a reactive gas for reactive evaporation, and adjusting the pressure of the reactive gas thus introduced. For this method, therefore, the interval between the displacement of the two gases and the adjustment of the gas pressure constitutes lost time. According to this discharge method, the density of the current flowing into the material under treatment is on the order of 0.1 mA/cm$^2$. For the efficiency of the cleaning to be enhanced, therefore, the current density must be elevated.

Since the mean free path for collision of gaseous atoms and molecules is on the order of less than 1 mm under a pressure of about $10^{-2}$ Torr, the ions directed to bombard the metallic material under treatment loose their energy because of the inelastic collision with gaseous atoms and molecules before they reach the metallic material. The method thus has another disadvantage that the frequency of collison with high-speed ions is lowered. When a steel material under treatment is coated with titanium nitride, for example, the steel material is desired to have its surface hardened by nitriding in advance so that the material may acquire improved adherence and wear resistance. When the glow discharge is effected in nitrogen gas under the aforementioned conditions, the metallic material cannot be given effective nitriding. Under these conditions, the temperature elevation of the material under treatment is small (not more than about 120° C.). When the coating is desired to be carried out at a temperature of more than 200° C., for example, the metallic material under treatment requires a heat source of its own. Owing to these disadvantages, the glow discharge treatment has been in need of improvement.

SUMMARY OF THE INVENTION

An object of this invention is to provide a method for the ion-bombardment surface treatment which enables the metallic material under treatment to be subjected to an evaporation treatment immediately after a cleaning treatment.

Another object of this invention is to provide a method for the ion-bombardment surface treatment which improves the efficiency of cleaning by increasing the density of the electric current flowing into the metallic material under treatment.

A further object of this invention is to provide a method for the ion-bombardment surface treatment which enables the temperature of the metallic material under treatment to be elevated while the treatment is in process.

To accomplish the objects described above according to the present invention, there is provided a method for the ion-bombardment surface treatment which comprises causing a hot filament to discharge thermionicelectrons within the atmosphere of a reactive gas under the same pressure as during the evaporation on the order of $10^{-3}$ to $10^{-4}$ Torr, applying a high negative voltage to the metallic material under treatment within the reaction gas which has been ionized in consequence of the discharge thereby effecting ion bombardment of the surface of the metallic material under treatment. By this treatment, a diffusion-like layer of the atoms of the reaction gas and the metal of the metallic material is formed on the surface of the metallic material, so that the metallic material may acquire improved adherence with the film to be produced by the subsequent reactive evaporation.

The other objects and the other characteristics of the present invention will become apparent from the further disclosure of the invention to be given hereinbelow with reference to the accompanying drawing.

BRIEF DESCRIPTION OF THE DRAWING

FIG. 1 is a schematic structural diagram illustrating one embodiment of the evaporation device to be used for working the present invention.

FIG. 2 is a structural diagram illustrating another embodiment of the evaporation device used for working the present invention.

FIG. 3 is a schematic structural diagram of a treating chamber in the device of FIG. 2.

FIG. 4 is a graph illustrating the amount of nitrogen existing on the surface of a material under treatment as measured by Auger electron microscopy.

FIG. 5 is a graph illustrating the condition of temperature elevation of a material under treatment.

FIG. 6 is a graph illustrating the voltage-current characteristic of a material under treatment.

FIG. 9(A) is a photograph taken by a scanning microscope to illustrate wear scars produced in consequence of a friction test on stainless steel which had been treated in advance by the method of the present invention.

FIG. 9(B) is a photograph taken by the scanning microscope to illustrate wear scars produced in consequence of the friction test on a stainless steel which had not been treated.

FIG. 10(A) is a graph showing the surface coarseness of the wear scars of FIG. 9(A).

FIG. 10(B) is a graph showing the surface coarseness of the wear scars of FIG. 9(B).

DESCRIPTION OF PREFERRED EMBODIMENT

Figure 7:
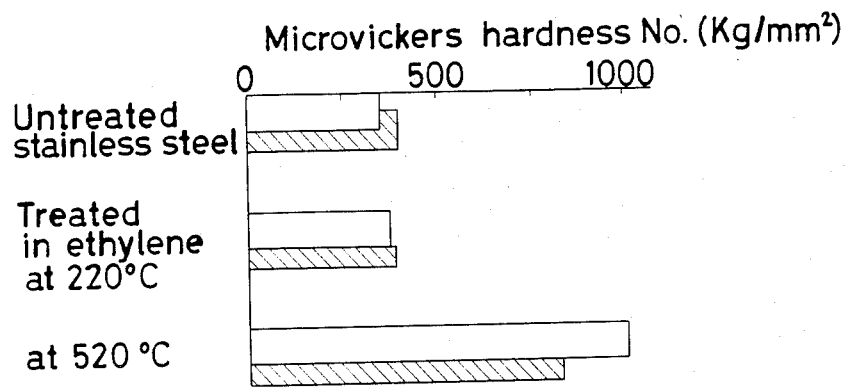
FIG. 7 is a graph illustrating the hardness of a material treated by the method of the present invention and the hardness of the material untreated.

FIG. 1 represents a schematic diagram illustrating one typical vacuum deposition device suitable for working out the method of the present invention for ion-bombardment surface treatment. This vacuum deposition device is provided with a vacuum deposition chamber 1 of airtight construction. Inside this vacuum deposition chamber 1, there are disposed a vaporization source 3, an electron beam generating device 4, a hot filament 5, and a discharge electrode 6. Above the discharge electrode 6 is positioned an article 2 which is to be coated with a film formed by physical vapor deposition. To the hot filament 5, the discharge electrode 6, and the article 2 under treatment are respectively connected a heater power source 8, a discharge activation power source 9, and a DC power source 7.

In the vacuum deposition device constructed as described above, the article 2 to be treated is cleaned by way of pretreatment. This pretreatment is effected by setting the article 2 fast in position within the vacuum deposition chamber 1, evacuating the interior of the vacuum deposition chamber 1 of air, and thereafter introducing into the chamber interior a reaction gas which is used during the subsequent vacuum deposition. The pressure to which the introduced reaction gas is compressed is on the order of $10^{-4}$ to $10^{-3}$ Torr. Then, a negative voltage of a few hundreds to a few thousands of volts is applied to the article under treatment. The hot filament 5 is incandesced on being supplied with electric power of about 10 volts and 50 amperes. When a positive potential of the order of 100 volts is applied to the discharge electrode 6 while the hot filament 5 is thus incandesced, there ensues the phenomenon of discharge due to release of thermionicelectrons. Owing to the discharge, part of the reaction gas is dissociated and ionized and positive ions with high energy collide against the article under treatment. By this collision, the contaminated substances and adsorbed substances depositing to the surface of this article are removed by the resultant action of sputtering. Further, part of the positive ions penetrate into the article to form a diffusion-like layer beneath the surface.

After the article under treatment has undergone the pretreatment described above, it is subjected to the main treatment for physical vapor deposition. In an atmosphere of the same reaction gas under the same pressure as during the pretreatment by discharge, the electron beam generator 4 is actuated to emit an electron beam and heat and vaporize the metallic substance held in the vaporization source 3 and the phenomenon of discharge is utilized to activate the metallic substance and the reaction gas and form a film of metallic compound on the article 2 under treatment.

FIG. 1 depicts an embodiment wherein the vacuum deposition device effects the surface treatment of the article and physical vapor deposition of film on the article both within one and the same enclosure. In contrast, FIG. 2 depicts an embodiment wherein the vacuum deposition device effects these treatments in separate enclosures. This vacuum deposition device comprises a surface treatment chamber 11, a vacuum deposition chamber 12, and a cooling chamber 13. These three chambers are formed as juxtaposed in the order mentioned above with valves interposed one each between the adjacent chambers. The surface treatment chamber 11 is constructed as illustrated in detail in FIG. 3. The surface treatment aimed at by the present invention is carried out within this surface treatment chamber 11. To be specific, the surface treatment chamber 11 is airtightly constructed. Within this chamber, one filament 5 and one discharge electrode 6 are opposed to each other across an article 2 under treatment which is rotatably set in position. The filament 5 is adapted to serve an additional purpose of heating the article 2 under treatment.

In the device constructed as described above, the interior of the surface treatment chamber 11 is evacuated of air to a high vacuum of the order of $10^{-5}$ to $10^{-6}$ Torr and then filled with the reaction gas to a pressure of about $10^{-3}$ to $10^{-4}$ Torr, which is substantially the same as the pressure during the subsequent vacuum deposition treatment. Then the filament 5 for emission of thermionic-electrons is incandesced and the discharge electrode 6 is subjected to application of a positive voltage (about several ten V) relative to the filament 5. Consequently, the filament 5 emits thermionicelectrons and induces the phenomenon of discharge. When ethylene ($C_2H_4$) is used as the reaction gas, for example, the discharge causes the following dissociation of the reaction gas:

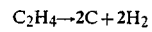

And the dissociated carbon is ionized as follows:

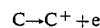

As the article under treatment is kept under application of a high negative voltage, the ionized carbon species are accelerated by the electric field formed by the article under treatment.

Since the mean free path of collision within a gas under a pressure of the order of $10^{-4}$ Torr is several centimeters, the ionized carbon particles are very rarely deprived of energy by collision with other neutral gas and are allowed to impinge on the article under treatment with energy almost equivalent to the voltage applied to the article under treatment. Consequently, the ionized carbon species are enabled to penetrate into the wall of the article under treatment. The vacuum evaporation device of this embodiment contributes to economization of energy in the sense that the filament 5 fulfills not only the role of releasing thermionicelectrons but also the role of heating the article under treatment by radiation.

The article under treatment which has undergone the surface treatment in the surface treatment chamber 11 as described above is then forwarded to the vacuum deposition chamber 12. This transfer of the article 2 can be simply effected because the kind and the pressure of the reaction gas used in the vacuum deposition chamber 12 are the same as those of the surface treatment chamber 11. Within the vacuum deposition chamber 12, the electron beam is utilized to heat and vaporize the metallic substance held in the vaporization source and the phenomenon of discharge is utilized to activate the metallic substance and the reaction gas and consequently form a film of metallic compound on the article under treatment. When the formation of the film of metallic compound on the article is completed, the article under treatment is forwarded to the cooling chamber 13, where it is subjected to forced cooling. After the cooling, the article is removed from the cooling chamber 13 as a finished product.

Now, the characteristics of the method of discharge treatment according to this invention will be described. In the first place, the working pressure is the same as the pressure of the reaction gas used during the vacuum deposition and one and the same gas is used in the pretreatment and in the treatment of vacuum deposition. When the pretreatment of discharge cleaning is shifted to vacuum deposition treatment, therefore, neither switch of gas valves nor adjustment of gas pressure is required. As a result, the time othrewise necessary for displacement of gases and adjustment of gas pressure can be eliminated and no measure is required for protection of the article under treatment against possible contamination during the introduction of the reaction gas prior to the physical vapor deposition or during the adjustment of gas pressure. As compared with the conventional glow discharge treatment which has required a gas pressure of $10^{-2}$ Torr, the discharge treatment involved as a pretreatment in the present invention uses a pressure equivalent to the pressure of the atmosphere for vacuum deposition which is $10^{-4}$ to $10^{-3}$ Torr, a level one to two powers of ten lower. Thus, the mean free path for collision of atoms and molecules falls on the order of at least 1 cm, with the result that the ion particles accelerated by the DC electric field are very rarely deprived of energy by inelastic collision with other molecules and atoms. Consequently, the ion particles are enabled to collide into the article under treatment with a high energy which is determined by the voltage applied to the article under treatment. The ions of the gas, therefore, not merely give effective cleaning to the surface of the article under treatment but also pass partly through the surface into the wall of the article under treatment.

When a film of some nitride is desired to be formed on the article under treatment, for example, the intimacy of adhesion of the film of this nitride to the article under treatment during the physical vapor deposition can be enhanced by causing nitrogen from nitrogen gas to pass through the surface into the wall of the article during the preliminary surface treatment.

Now, the present invention will be described more specifically below with reference to examples.

EXAMPLE 1

A piece of stainless steel (SUS 304) was set in position within the vacuum deposition chamber in a device constructed as illustrated in FIG. 1. The vacuum deposition chamber was evacuated of air to a high vacuum of $10^{-5}$ Torr and then filled with nitrogen gas to a pressure of $10^{-3}$ Torr. In the resultant atmosphere, electric power of 10 V and 50 A was applied to the hot filament, a potential of several ten V was applied to the discharge electrode, and a potential of $-2000$ V was applied to the stainless steel piece respectively for 20 minutes, to effect a cleaning treatment of the article.

Subsequently, the article was to be subjected to the vacuum deposition treatment. For this purpose, the article was removed from the vacuum deposition chamber and tested by Auger electron spectroscopy for relative peak intensity of nitrogen in the direction of depth relative to iron. The results were as shown in FIG. 4. It was not until after the removal of surface substance from the article by the argon ion bombardment had been continued for about 1000 minutes that presence of nitrogen atom on the surface of the article was no longer detected.

For comparison, the article was held in nitrogen gas under a pressure of $10^{-2}$ Torr and subjected to a glow discharge treatment under application of a potential of $-2000$ V. The results were as shown by a dotted line in the graph of FIG. 4. It is noted from this graph that the signal indicating the presence of nitrogen atom on the surface of the article disappeared after the bombardment of the surface with argon ions had been continued for about 100 minutes. Comparison of the data indicates that by the method of treatment of this invention, nitrogen atoms are caused to pass into the wall of the article to nearly ten times the depth obtained by the glow discharge method and form a diffused layer therein.

EXAMPLE 2

In an atmosphere of nitrogen gas under a pressure of $5 \times 10^{-4}$ Torr, a soft-iron disk 10 mm in diameter and 1 mm in thickness was exposed to an electric discharge. In this case, the disk was heated owing to the transfer of energy from the discharge plasma to the disk. During this treatment, the disk was measured for heating condition. The results were as shown in FIG. 5. From the graph, it is noted that the temperature of the disk rises past 200° C. within 15 minutes of starting the discharge. This increase of temperature, as compared with about 100° C. obtained by the conventional glow discharge, indicates that the method of the present invention excels the conventional method in terms of effect of heating. Further, during the treatment mentioned above, the disk was tested for voltage-current characteristics. The results were as shown in FIG. 6. The same characteristics were obtained, for comparison, of the glow discharge treatment performed in an atmosphere of nitrogen gas under a pressure of $2 \times 10^{-2}$ Torr. The results were as shown by the dotted line in the same graph. Comparison of the data shows that the treatment of the present invention enjoys a current density about 10 times as high as the current density obtained by the glow discharge method.

EXAMPLE 3

A hardened and annealed die steel (SKD 11) having a micro-Vickers hardness 710 kgf/mm² was used as an article for treatment. In an atmosphere of ethylene under a pressure of $5 \times 10^{-4}$ Torr, the die steel having part of the surface thereof masked was subjected to discharge treatment. The die steel was subjected to application of a potential of $-1000$ V and further heated with a heater to 500° C. After the discharge treatment was continued for 25 minutes, the exposed portion and the masked portion of the die steel were tested for Vickers hardness. The values were 750 kgf/mm² and 670 kgf/mm² respectively. Since the masked portion was not exposed to the discharge treatment and therefore was annealed, it showed a lower hardness than the die steel which was not treated at all.

EXAMPLE 4

A piece of stainless steel (SUS 304) was set in position within the vacuum deposition chamber, with the interior of the chamber filled with ethylene to a pressure of $5 \times 10^{-4}$ Torr. While a power 6.5 V and 50 A was fed to the filament, a power of 95 V and 2 A to the discharge electrode, and a power of $-2000$ V and 50 mA to the stainless steel piece respectively, the interior of the chamber was kept at 250° C. in one test run and 520° C. in the other test run, each for 25 minutes.

The stainless steel pieces thus treated were tested for Vickers hardness under loads of 10 gf and 50 gf. The results were as shown in FIG. 7. In the graph, the white bars represent the results obtained under the load of 10 gf and the shaded bars those obtained under the load of 50 gf. It is noted from the graph of FIG. 7 that the stainless steel pieces subjected to the discharge treatment at 520° C. acquire increased hardness.

Figure 8:
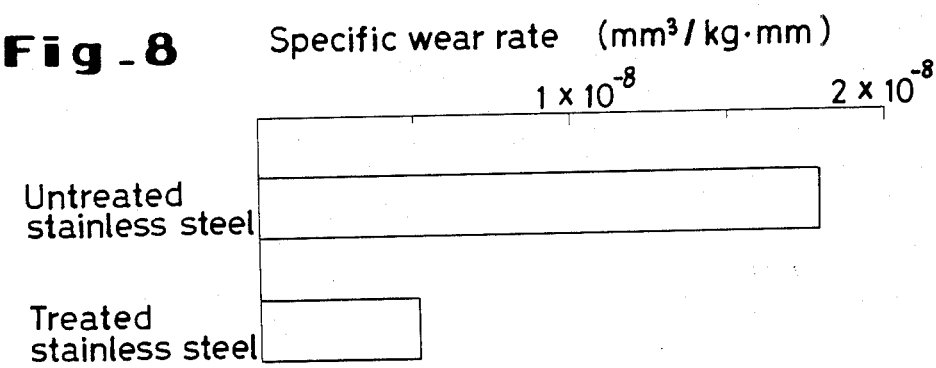
FIG. 8 is a graph illustrating the results of a wear test.

The stainless steel pieces which had undergone the hardening treatment were tested for wear resistance by an Ohkoshi-type wear machine in the absence of lubricant under the conditions of 0.51 m/s of speed, 3.3 kg of final load, 400 m of total distance of travel and SK steel as mating material. The results were as shown in FIG. 8. It is noted from the graph that the specific wear rate in the stainless steel pieces treated was one third of the specific wear rate of the untreated stainless steel pieces.

Then, the stainless steel piece which had undergone the discharge treatment at 520° C. was given 1000 traversals of sliding against a steel ball under a load of 100 gf at a speed of 2 mm/sec. A photomicrograph of the frictional track formed on the stainless steel piece is shown in FIG. 9(A), and the surface coarseness of the frictional track in FIG. 10(A). For comparison, a stainless steel piece was given traversals of sliding under the same condition. The photomicrograph of the track on this stainless steel piece and the surface coarseness of the track are shown respectively in FIG. 9(B) and FIG. 10(B).

It is clearly noted from the photos and the diagrams that the untreated stainless steel piece sustained clearly severe damage and the stainless steel piece treated by the method of this invention sustained substantially mild damage, indicating that the method of this invention imparts notable wear resistance to the stainless steel piece.

Figure 11:
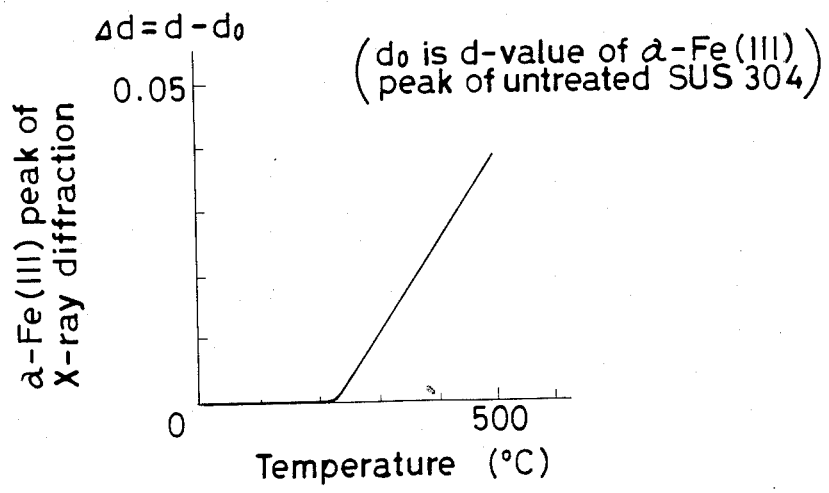
FIG. 11 is a graph showing the α-Fe(III) peak in X-ray diffraction.

Further, the stainless steel pieces were tested by X-ray diffraction for amount of shift of the d value, with emphasis on the $\alpha$-Fe(III) peak. The results were as shown in FIG. 11. It is noted from this graph that the d value of the stainless steel piece treated at 500° C. deviated to an increasing side and showed a rather expanded peak as compared with the untreated stainless steel piece.

What is claimed is:

1. A method for the ion bombardment treatment of the surface of an article on which a metallic compound is to be vapor deposited by reactive ion plating, which comprises the steps of:

placing the article under treatment in a reaction gas at a pressure within the range of $10^{-3}$ to $10^{-4}$ Torr;

causing a hot filament to release thermoionic electrons in said reaction gas, thereby inducing electric discharge;

applying a negative voltage to the article; and bombarding the article under treatment with ions of the reaction gas ionized by said electric discharge.

2. A method according to claim 1, wherein said reaction gas is hydrocarbon gas.

3. A method according to claim 1, wherein said reaction gas is nitrogen gas.

* * * * *